(12) United States Patent  
Sridhar et al.

(10) Patent No.: US 7,172,936 B2
(45) Date of Patent: Feb. 6, 2007

(54) METHOD TO SELECTIVELY STRAIN NMOS DEVICES USING A CAP POLY LAYER

(75) Inventors: Seetharaman Sridhar, Richardson, TX (US); Antonio Luis Pacheco Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 218 days.

(21) Appl. No.: 10/949,447

(22) Filed: Sep. 24, 2004

(65) Prior Publication Data

US 2006/0073650 A1    Apr. 6, 2006

(51) Int. Cl.
*H01L 21/8238* (2006.01)

(52) U.S. Cl. .................. 438/231; 438/275; 438/305

(58) Field of Classification Search ............... 438/199, 438/229–231, 305, 530, 743–744, 787–788, 438/791–792, 954, 275
See application file for complete search history.

(56) References Cited

U.S. PATENT DOCUMENTS

| | | | |
|---|---|---|---|
| 5,019,882 | A | 5/1991 | Solomon et al. |
| 5,241,197 | A | 8/1993 | Murakami et al. |
| 5,683,934 | A | 11/1997 | Candelaria |
| 5,863,827 | A | 1/1999 | Joyner |
| 5,882,981 | A | 3/1999 | Rajgopal et al. |
| 6,004,871 | A | 12/1999 | Kittl et al. |
| 6,087,241 | A | 7/2000 | St. Amand et al. |
| 6,180,454 | B1 | 1/2001 | Chang et al. |
| 6,211,064 | B1 | 4/2001 | Lee |
| 6,214,699 | B1 | 4/2001 | Joyner |
| 6,261,964 | B1 | 7/2001 | Wu et al. |
| 6,284,233 | B1 | 9/2001 | Simon et al. |
| 6,284,626 | B1 | 9/2001 | Kim |
| 6,284,633 | B1 | 9/2001 | Nagabushnam et al. |
| 6,303,486 | B1 | 10/2001 | Park |
| 6,368,967 | B1 | 4/2002 | Besser |
| 6,380,029 | B1 | 4/2002 | Chang et al. |

(Continued)

OTHER PUBLICATIONS

Antonio L. P. Rotondaro, et al., "Method to Selectively Recess Etch Regions on a Wafer Surface Using Capoly as a Mask" U.S. Appl. No. 10/931,195, filed Aug. 31, 2004.

(Continued)

*Primary Examiner*—M. Wilczewski
*Assistant Examiner*—Toniae M. Thomas
(74) *Attorney, Agent, or Firm*—Rose Alyssa Keagy; W. James Brady; Frederick J. Telecky, Jr.

(57) ABSTRACT

The present invention facilitates semiconductor fabrication by providing methods of fabrication that selectively apply tensile strain to channel regions of devices while mitigating masking operations employed. A cap poly layer is formed over NMOS and PMOS regions of a semiconductor device. Then, a resist mask is employed to remove a portion of the cap poly layer from the PMOS region. Subsequently, the same resist mask and/or remaining portion of the cap poly layer is employed to form source/drain regions within the PMOS region by implanting a p-type dopant. Afterward, a cap poly thermal process is performed that causes tensile strain to be induced only in channel regions of devices located within the NMOS region. As a result, channel mobility and/or performance of devices located in the PMOS region is not substantially degraded.

20 Claims, 10 Drawing Sheets

U.S. PATENT DOCUMENTS

| | | |
|---|---|---|
| 6,406,973 B1 | 6/2002 | Lee |
| 6,495,853 B1 | 12/2002 | Holbrook et al. |
| 6,573,172 B1 | 6/2003 | En et al. |
| 6,767,778 B2 | 7/2004 | Wang et al. |
| 2003/0111699 A1 | 6/2003 | Wasshuber et al. |
| 2003/0181005 A1* | 9/2003 | Hachimine et al. ......... 438/231 |
| 2004/0115897 A1* | 6/2004 | Inoue et al. ................ 438/424 |
| 2005/0199958 A1* | 9/2005 | Chen et al. ................. 257/368 |
| 2006/0046367 A1* | 3/2006 | Rotondaro et al. ......... 438/199 |

OTHER PUBLICATIONS

U.S. Appl. No. 10/877,154, filed Jun. 25, 2004, Chidambaram.
U.S. Appl. No. 10/901,568, filed Jul. 29, 2004, Chidambaram et al.

* cited by examiner

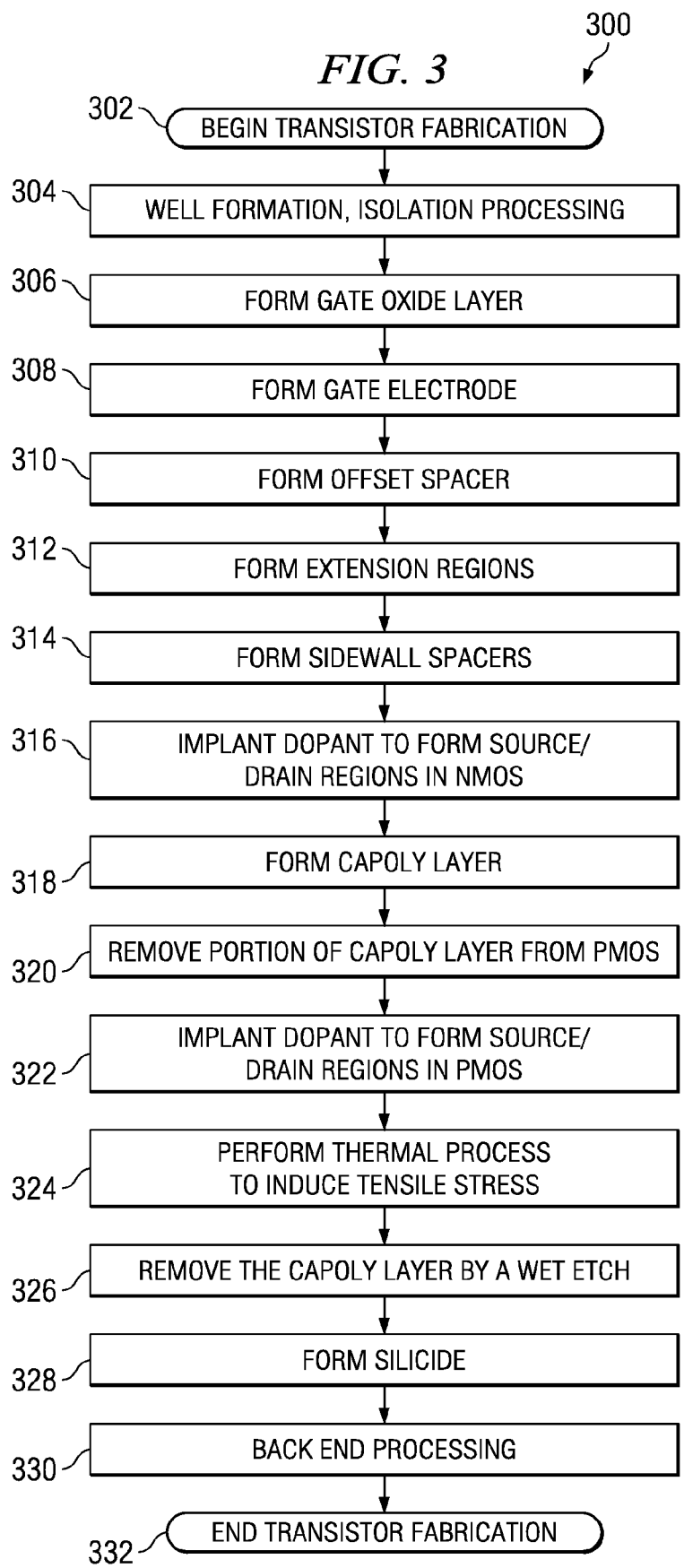

METHOD TO SELECTIVELY STRAIN NMOS DEVICES USING A CAP POLY LAYER

FIELD OF INVENTION

The present invention relates generally to semiconductor devices and more particularly to transistors and associated methods of manufacture having improved mobility due to channel strain.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to a mobility of carriers in the channel. Thus the higher the mobility of the carriers in the channel, the more current can flow and the faster a circuit can perform when using high mobility MOS transistors. One mechanism to increase the mobility of the carriers in the channel of an MOS transistor is to produce a mechanical stress or strain in the channel.

A compressive strained channel typically provides hole mobility enhancement, which is particularly beneficial for PMOS devices, whereas a tensile strained channel typically provides electron mobility enhancement, which is particularly beneficial for NMOS devices. An exemplary method of introducing tensile strain in a channel region is to cover transistor devices with a CAP layer comprised of a selected material that, when annealed, generates the tensile strain in the channel regions.

However, the tensile strain that improves electron mobility can also degrade hole mobility. As a result, introducing tensile strain to channel regions, such as by using a poly cap layer, can improve performance of NMOS devices but degrade performance of PMOS devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by selectively applying tensile stress only to channel regions of NMOS devices. As a result, channel mobility for NMOS devices can be improved without substantially degrading channel mobility for PMOS devices.

The present invention employs a poly cap layer that selectively covers an NMOS region containing NMOS devices. A thermal process is performed that induces tensile strain to channel regions of NMOS devices without inducing tensile strain to channel regions of PMOS devices. The poly cap layer is removed from a PMOS region prior to performing the thermal process thereby preventing or mitigating tensile stress from being induced in channel regions of PMOS devices and/or otherwise deleteriously affecting performance of PMOS devices. As a result, channel mobility and, as a consequence, device performance for PMOS devices is not substantially degraded.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 3 is a flow diagram illustrating a method of fabricating a semiconductor device wherein types of strain are selectively applied to an NMOS region in accordance with an aspect of the present invention.

DETAILED DESCRIPTION OF THE INVENTION

Figure 1:
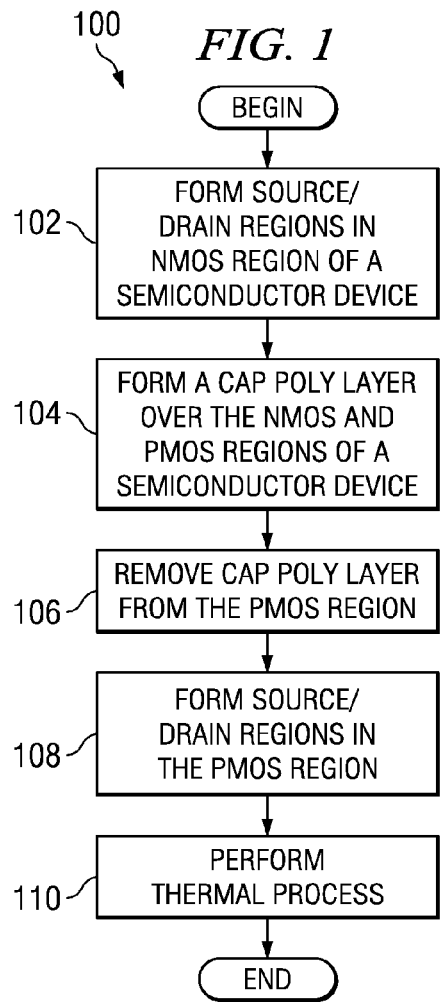
FIG. 1 is a flow diagram illustrating a method of fabricating a semiconductor device that selectively introduces strain into channel regions of transistor devices located within an NMOS region of a semiconductor device in accordance with an aspect of the present invention.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while reducing masks employed in fabrication thereof.

The present invention facilitates semiconductor fabrication by providing methods of fabrication that selectively apply tensile strain to channel regions of devices while mitigating masking operations employed. A cap poly layer is formed over NMOS and PMOS regions of a semiconductor device. Then, a resist mask is employed to remove a portion of the cap poly layer from the PMOS region. Subsequently, the same resist mask and/or remaining portion of the cap poly layer is employed to form source/drain regions within the PMOS region by implanting a p-type dopant. Afterward, a cap poly thermal process is performed that causes tensile strain to be induced only in channel regions of devices located within the NMOS region. As a result, channel mobility and/or performance of devices located in the PMOS region is not substantially degraded.

Conventionally, a cap poly layer is formed over a device and subjected to a thermal process, which can induce tensile strain to channel regions of the device. The inventors of the present invention appreciated that the induced strain improves electron mobility and, therefore, performance of NMOS devices, but degrades hole mobility and, therefore, performance of PMOS devices. The inventors of the present invention also appreciate that the composition of the cap poly layer, particularly when subjected to the thermal process, can deleteriously impact other characteristics of PMOS devices, such as by altering dopant profile, diffusability of implanted dopants, and the like.

One mechanism that can be employed to mitigate degradation of PMOS device performance and yet improve NMOS device performance via a cap poly layer is to employ a separate mask and remove a portion of the cap poly layer immediately prior to performing a thermal process. However, so doing requires a separate mask step thereby increasing fabrication time, cost, and possibility of defects.

FIG. 1 is a flow diagram illustrating a method 100 of fabricating a semiconductor device that selectively introduces strain into channel regions of transistor devices located within an NMOS region of a semiconductor device in accordance with an aspect of the present invention. The method 100 operates on a semiconductor device having NMOS and PMOS regions.

The method 100 begins at block 102 wherein source/drain regions are formed in active areas of an NMOS region by selectively implanting an n-type dopant. Typically, a layer of resist is formed and patterned to expose the NMOS region while covering a PMOS region. Subsequently, the n-type dopant is implanted at a selected energy and dose to form the source/drain regions having a selected dopant concentration and dopant profile.

Continuing at block 104, a cap poly layer, also referred to as a stacked poly cap or poly cap layer, is formed over the NMOS and PMOS regions of the semiconductor device. The cap poly layer is formed by depositing and/or growing one or more layers of materials (e.g., oxide, nitride, and the like) that introduce a desired type of strain in the NMOS region of the device when subjected to a thermal process. Generally, the cap poly layer is formed over active regions and gate electrodes of transistor devices in both the NMOS region and a PMOS region of the semiconductor device. A suitable cap poly layer is comprised of a lower insulative layer (e.g., oxide) and a middle layer formed on the lower layer comprised of a suitable material and thickness that introduces a desired amount of strain (e.g., nitride). A thin, top layer (e.g., oxide) is generally formed on the middle layer to facilitate patterning.

Subsequently, a portion of the cap poly layer is removed at 106 from the PMOS region. Typically, a layer of resist is formed and patterned to expose the PMOS region. Subsequently, one or more etches are performed that remove one or more layers of the cap poly layer.

The method 100 continues at block 108 wherein source/drain regions are formed in active areas of the PMOS region by selectively implanting a p-type dopant. Typically, a layer of resist would be formed and patterned to expose the PMOS region while covering a NMOS region. However, the present invention avoids an extra mask step by employing the layer of resist employed to remove the portion of the cap poly layer at block 106 to perform the source/drain implant of block 108. The p-type dopant is implanted at a selected energy and dose to form the source/drain regions having a selected dopant concentration and dopant profile.

A thermal process (e.g., an anneal) is performed at block 108 that causes the cap poly layer to introduce a type of strain (e.g., uniaxial tensile strain or biaxial tensile strain) across channel regions of transistor devices within the NMOS region. A suitable thermal process is a spike anneal that occurs for a relatively short time at a high temperature (e.g., about 800 degrees Celsius to 1200 degrees Celsius). A thickness and/or composition of the cap poly layer determines the amount of the second type of strain introduced into the channel regions of the NMOS region. The time and temperature of the anneal process can be selected to further select or adjust the amount of strain introduced. Typically, a higher temperature and/or longer time for the anneal process results in a greater amount of strain being applied.

Subsequently, the cap poly layer is removed at block 110, which allows additional fabrication procedures, such as silicidation and metallization, to be performed. One suitable mechanism to remove the cap poly layer is to employ a plasma dry etch selective to an underlying layer to remove the cap poly layer. For example, for a cap poly comprising an oxide covered by a nitride, a two-step etch process may be employed, wherein the first etch is selective to the oxide and the second etch is selective to the underlying layer.

Figure 2:
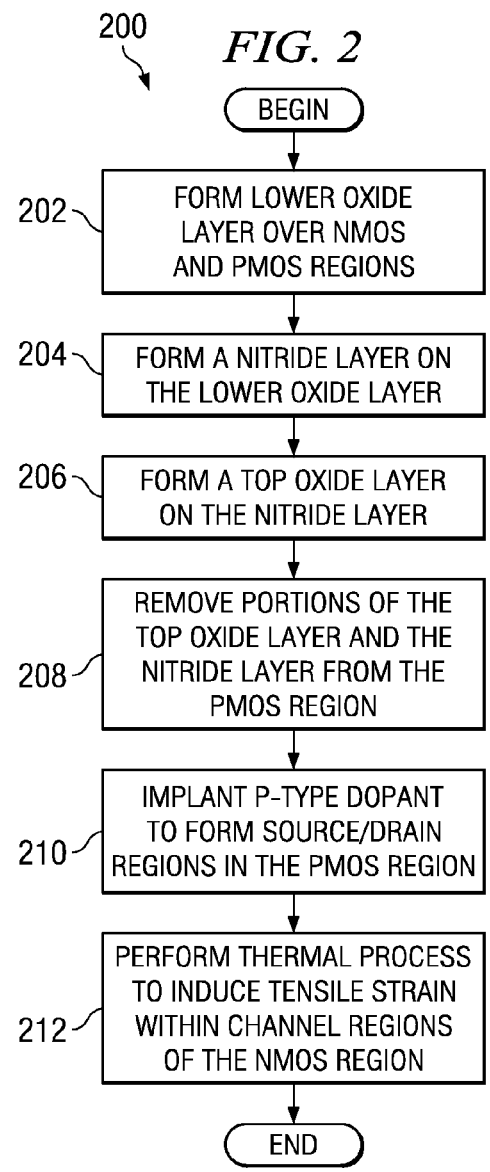
FIG. 2 is a flow diagram illustrating a method of fabricating and employing a cap poly layer in fabricating a semiconductor device in accordance with an aspect of the present invention.

Turning now to FIG. 2, a flow diagram illustrating a method 200 of fabricating and employing a cap poly layer in fabricating a semiconductor device in accordance with an aspect of the present invention is described. The method 200 forms the cap poly layer comprising a lower oxide layer, a nitride layer, and a top oxide layer. The cap poly layer can be employed as a mask for selective recess etching and also for selectively introducing tensile strain. Additionally, the cap poly layer formed in this method 200 can also be employed in the method 100 of FIG. 1, as described above.

The method 200 begins at block 202 wherein a lower oxide layer is formed over NMOS and PMOS regions of the semiconductor device. The lower oxide layer is grown or deposited (e.g., via CVD) and can later serve as an etch stop layer. A nitride layer is formed on the lower oxide layer at block 204. The nitride layer is formed to a suitable thickness that correlates to a desired amount of strain to induce later in the NMOS region. A top oxide layer is then formed (e.g., via CVD) on the nitride layer at block 206 and serves to facilitate patterning of the cap poly layer. It is appreciated that the top oxide layer can be absent in alternate aspects of the present invention.

A portion of the top oxide layer and the nitride layer is removed from the PMOS region of the semiconductor device at block 208 using a resist mask. Typically, a dry etch plasma process selective to oxide is employed to remove the nitride layer. The top oxide layer is also removed by the dry etch plasma process because it is relatively thin.

Subsequently, source/drain regions are formed in active areas of the PMOS region at block 210 by again reusing the resist mask from the block 208 to selectively implant a p-type dopant. By reusing the resist mask, a separate masking operation can be avoided saving time and cost.

A thermal process (e.g., an anneal) is performed at block 212 that induces tensile strain within channel regions of NMOS transistor devices within the NMOS region. A suitable thermal process is a spike anneal that occurs for a relatively short time at a high temperature. Thicknesses of the lower oxide layer, the nitride layer, and the top oxide layer along with parameters of the thermal process substantially determine the amount of tensile stress induced within the channel regions of the NMOS transistor devices. As a result, in addition to selecting thicknesses of the lower oxide layer, the nitride layer, and the top oxide layer, the time and temperature of the thermal process can be selected/adjusted to alter the amount of tensile strain induced. Generally, a higher temperature and/or longer time for the anneal process results in a greater amount of strain being applied.

Figure 4A:
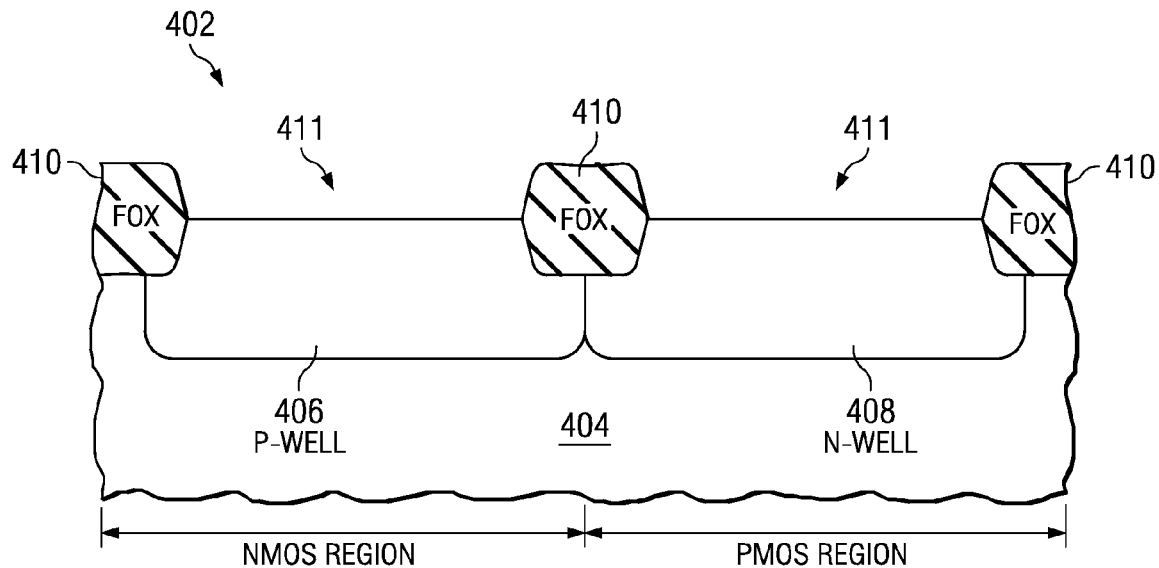
FIGS. 4A–4P are a plurality of fragmentary cross section diagrams illustrating a transistor device being formed in accordance with an aspect of the present invention.
Figure 4B:
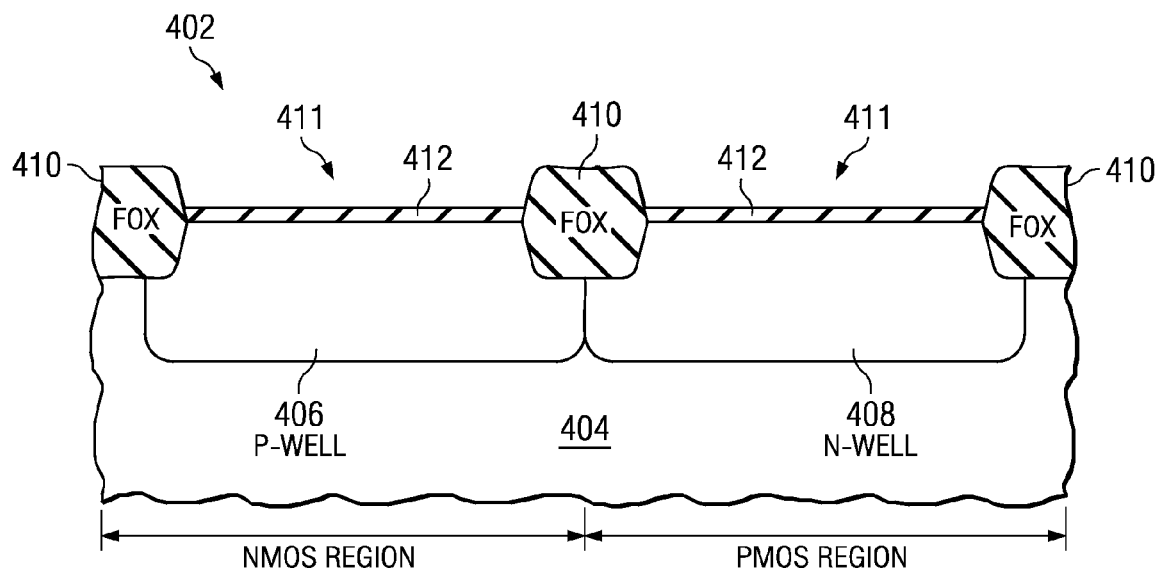
Figure 4C:
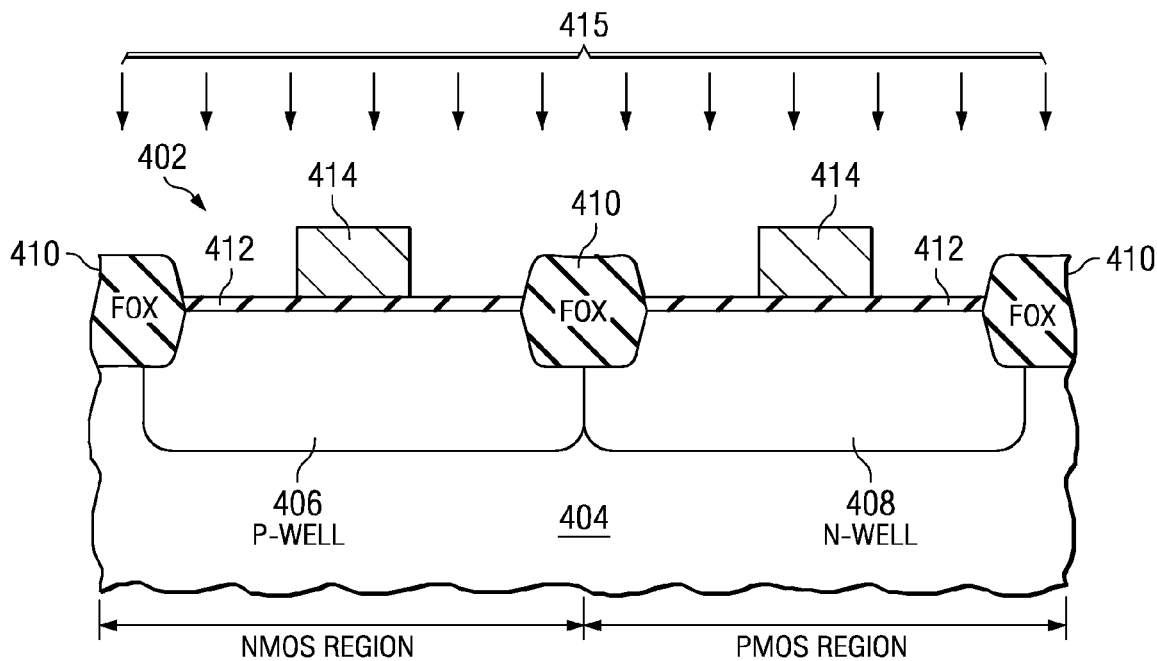
Figure 4D:
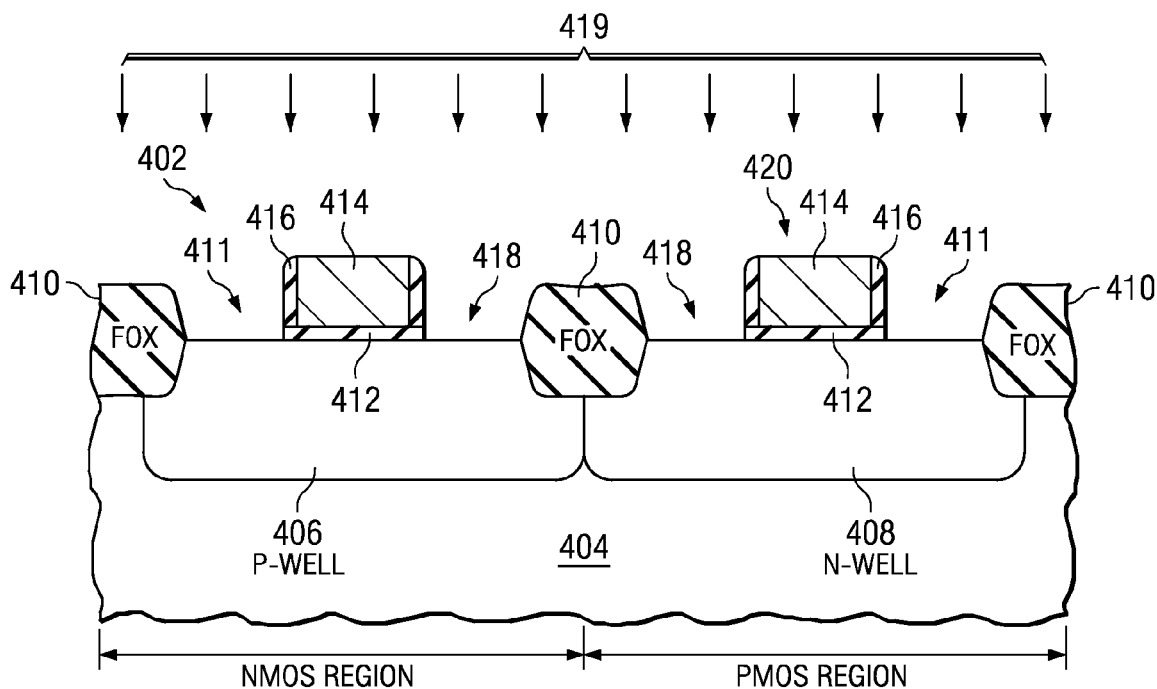
Figure 4E:
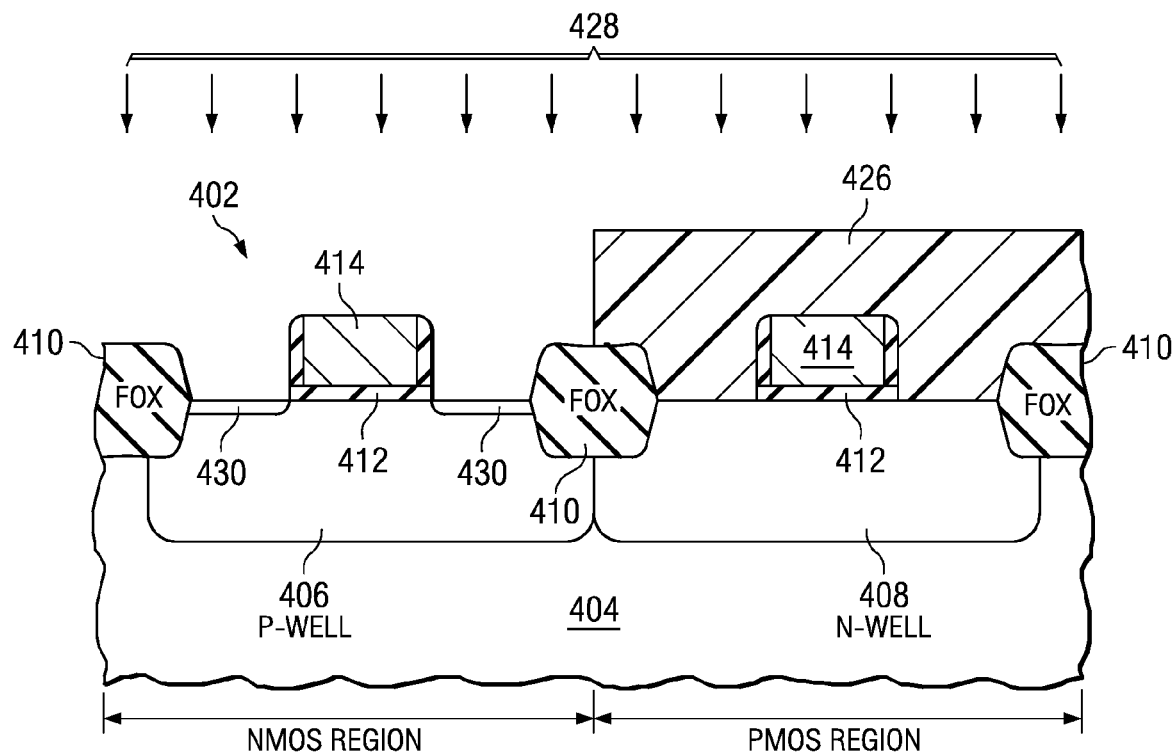
Figure 4F:
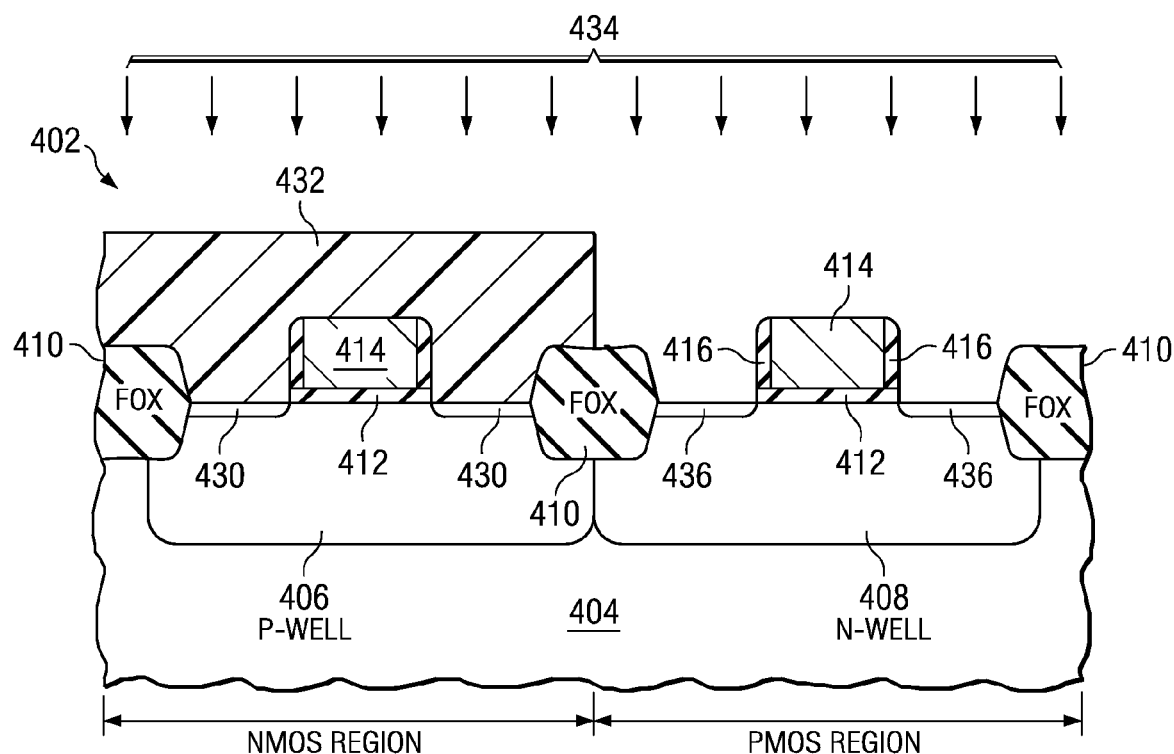
Figure 4G:
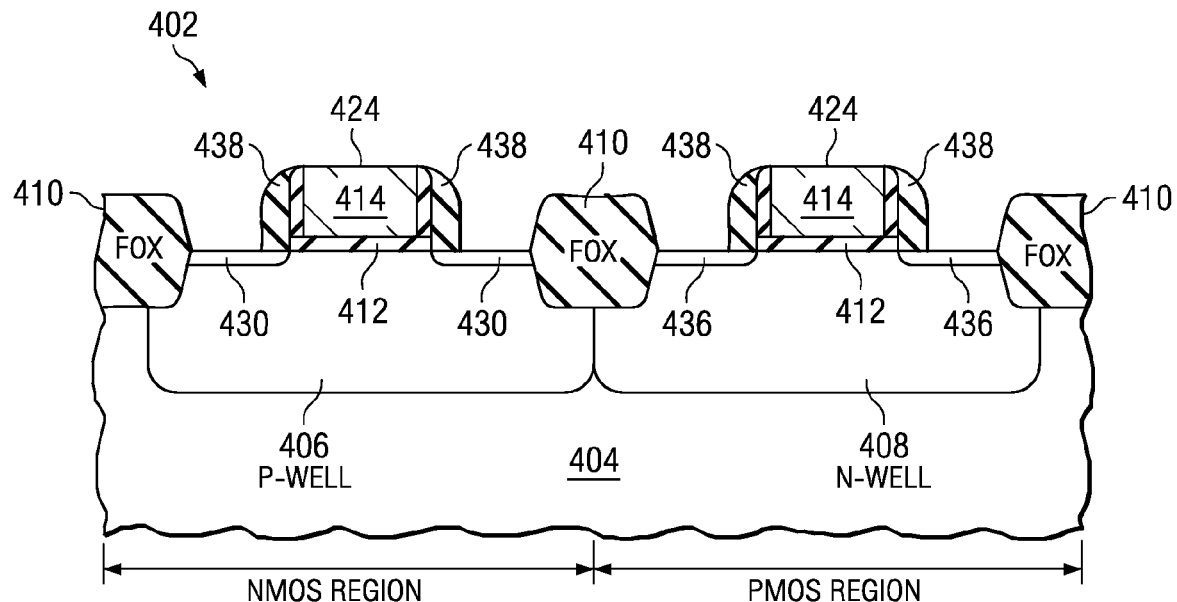
Figure 4H:
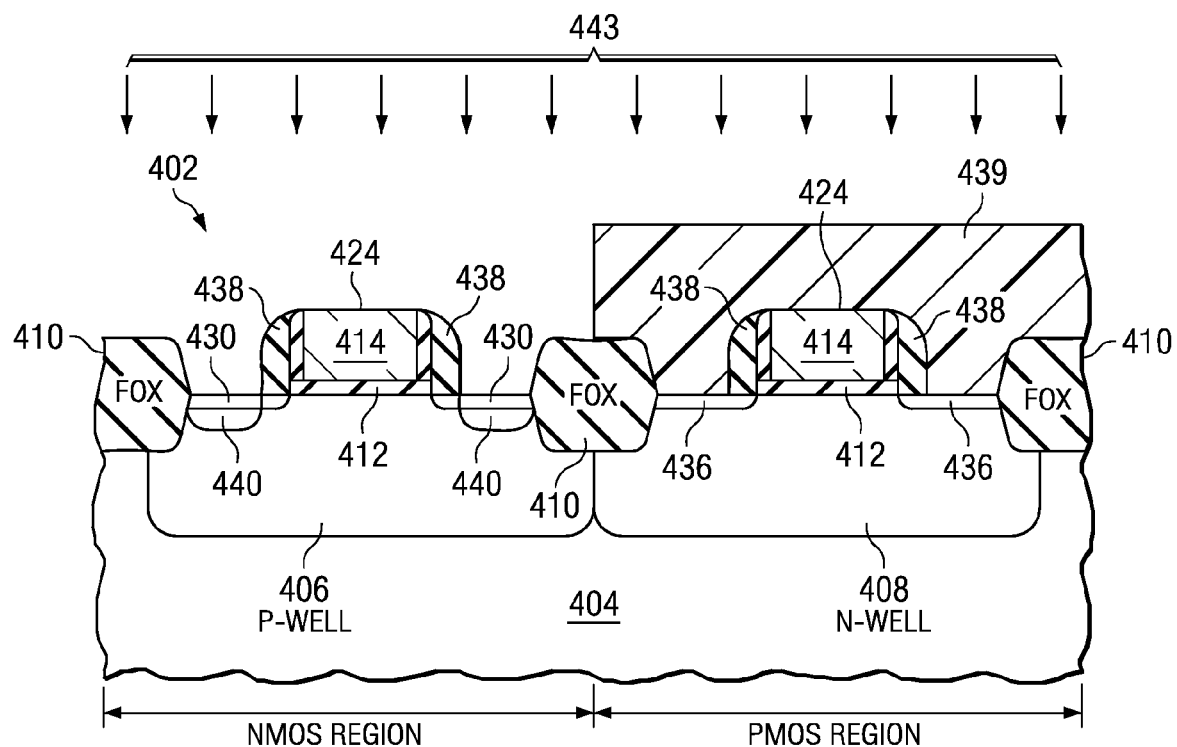
Figure 4I:
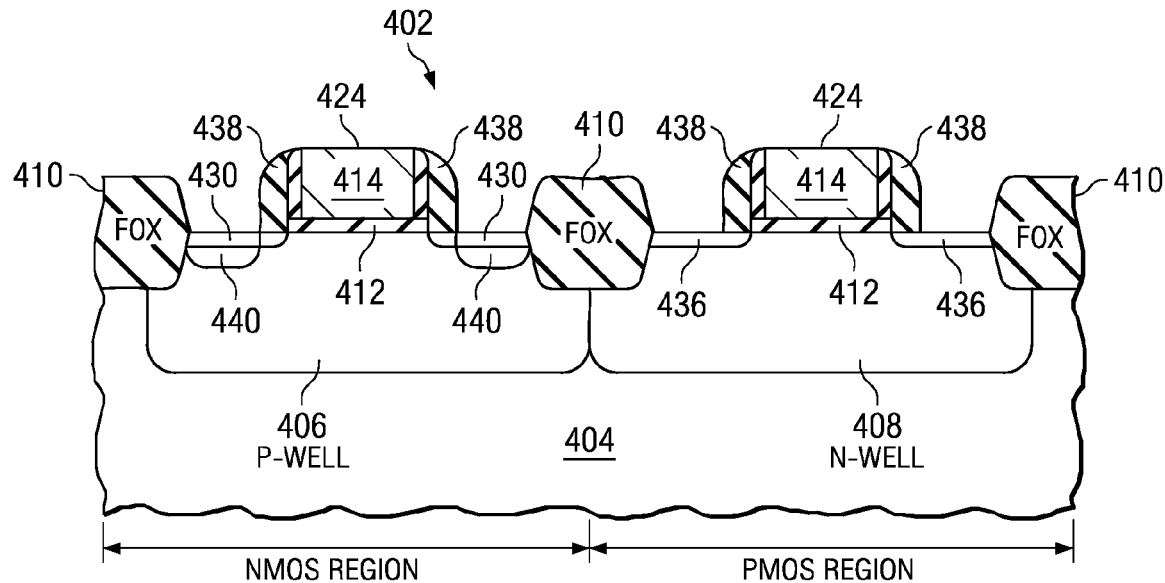
Figure 4J:
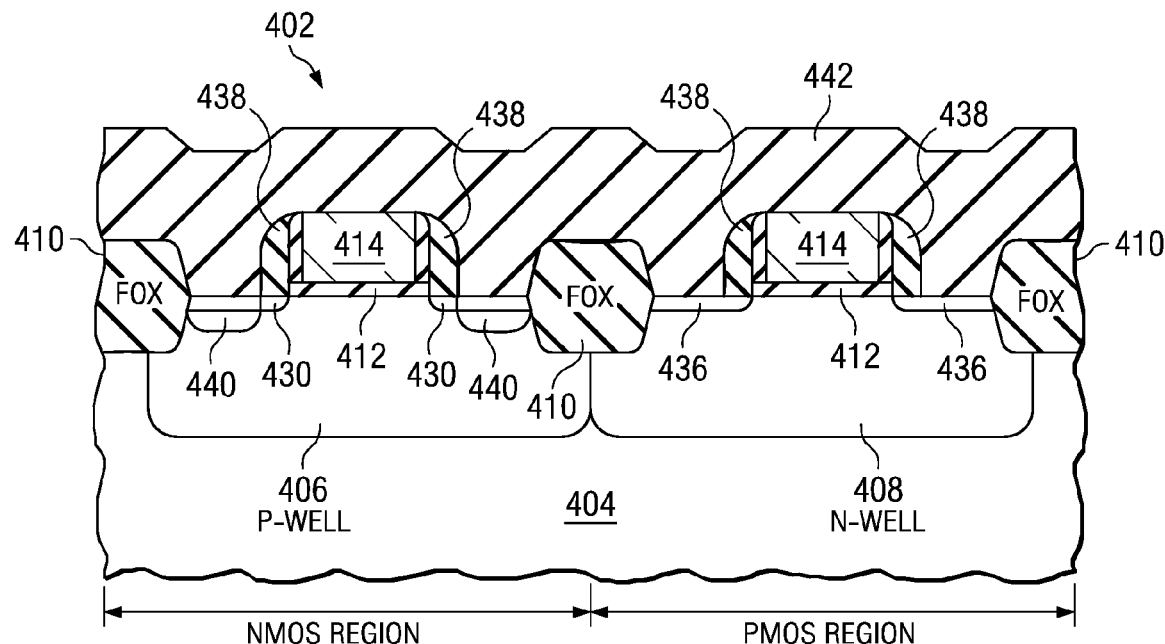
Figure 4K:
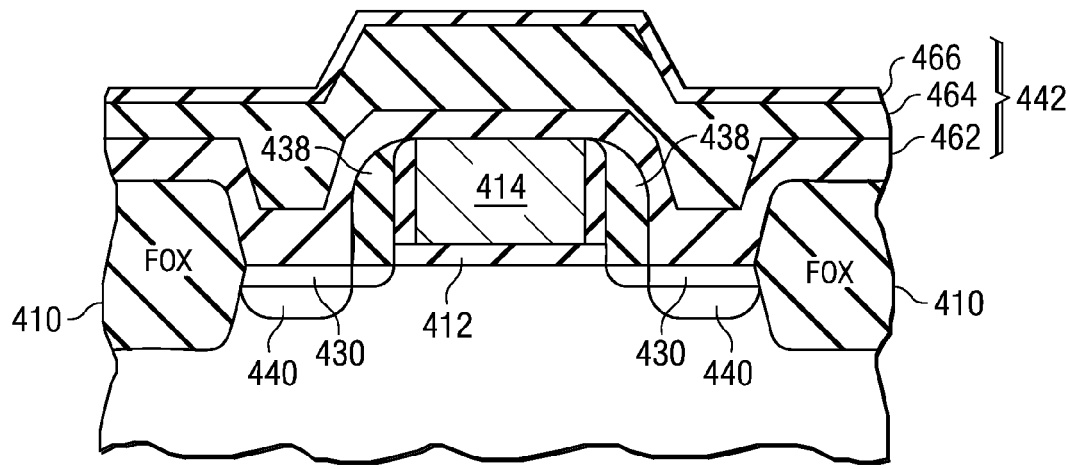
Figure 4L:
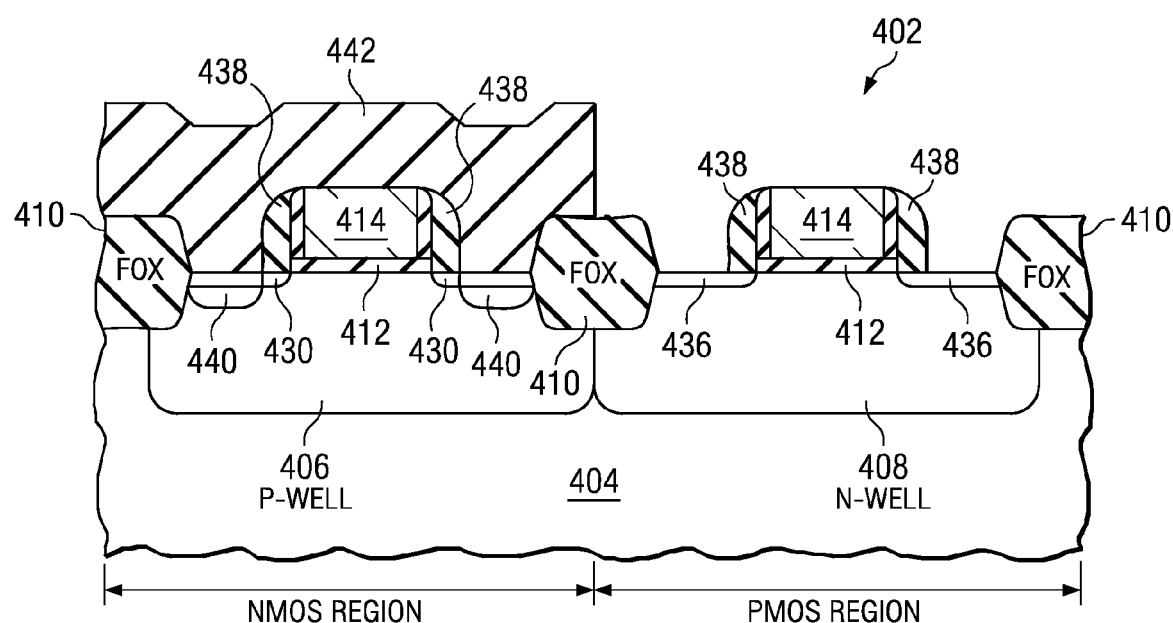
Figure 4M:
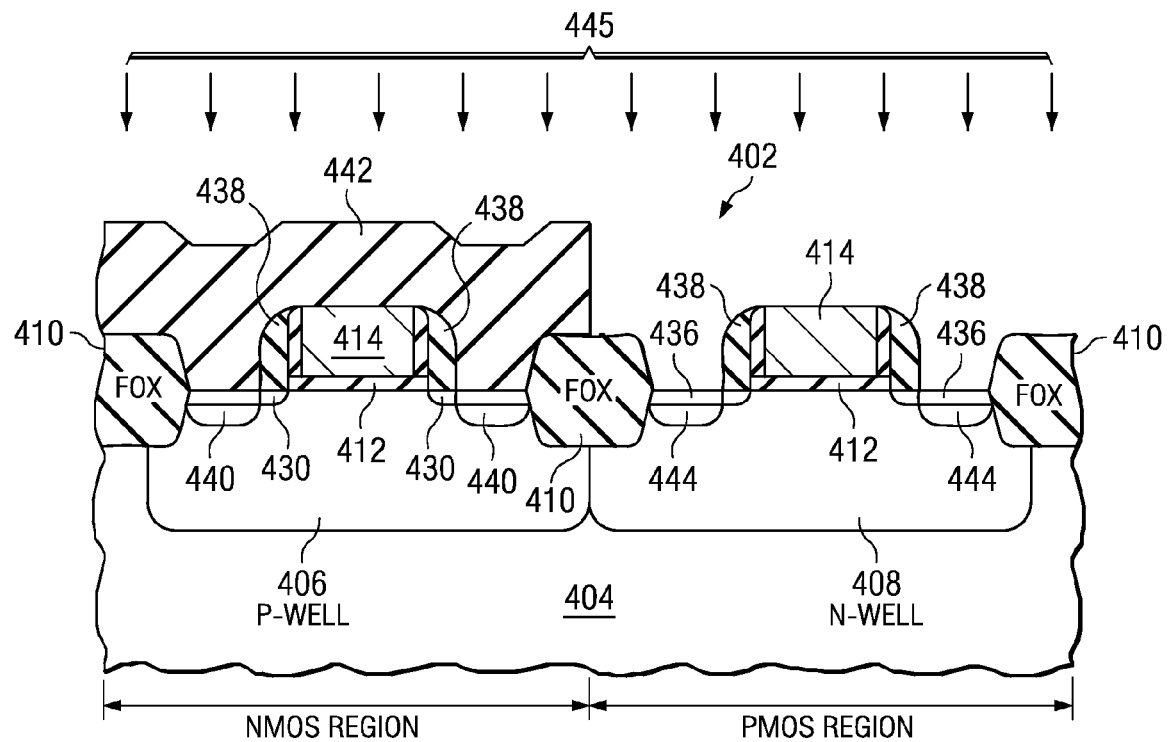
Figure 4N:
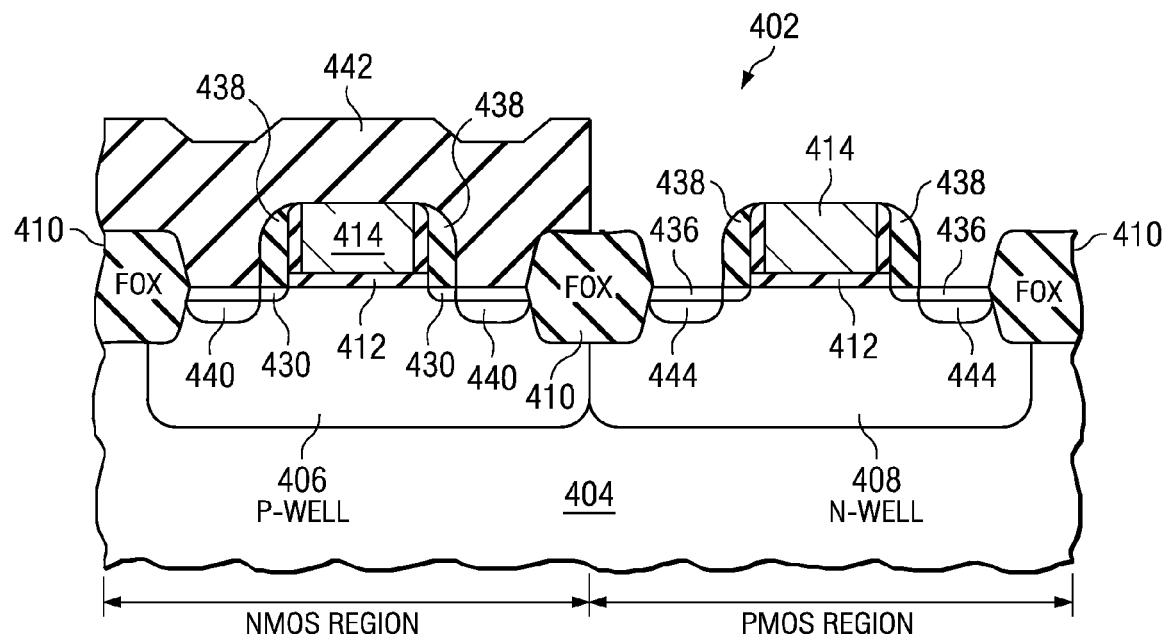
Figure 4O:
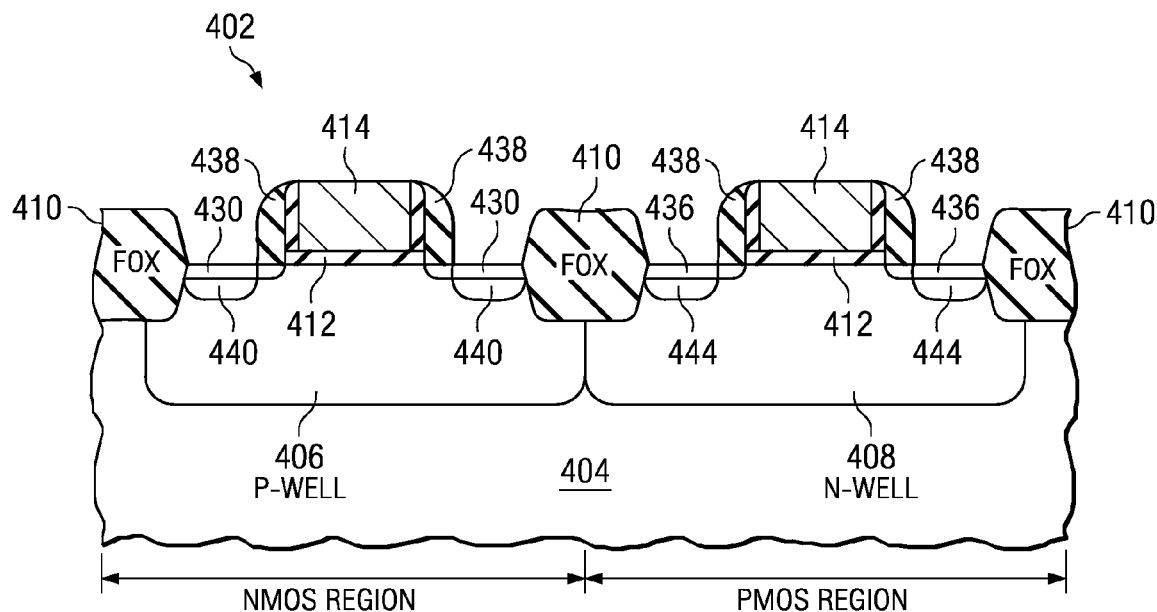
Figure 4P:
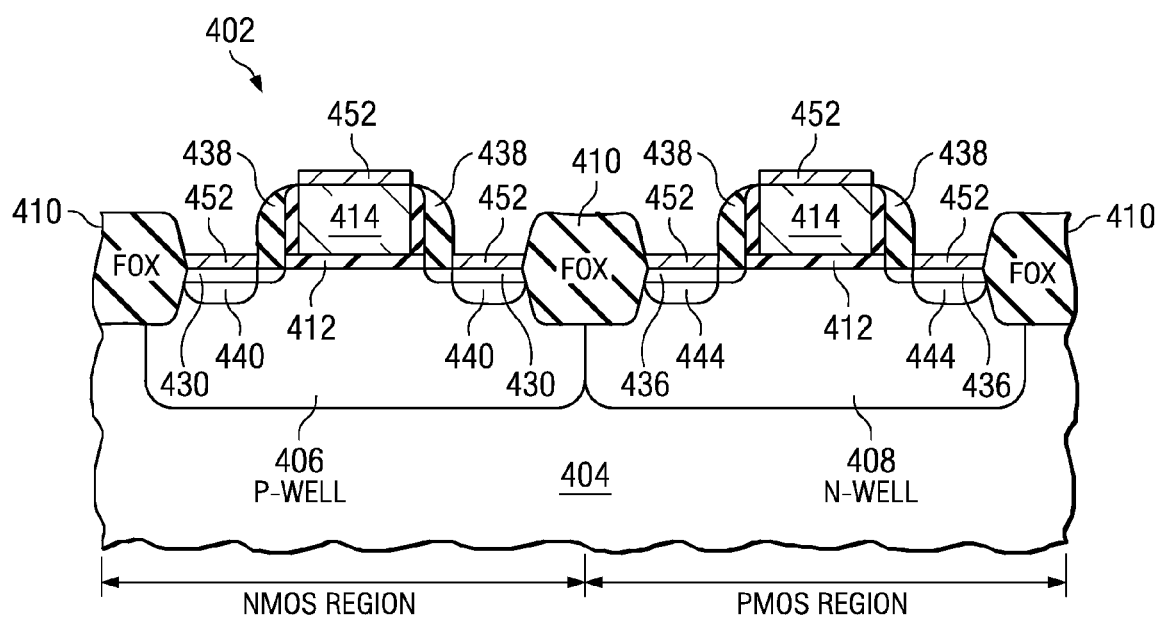

Referring to FIGS. 3 and 4A–4P, further aspects of the invention relate to methods of fabricating semiconductor devices, wherein FIG. 3 illustrates an exemplary method of fabrication in accordance with the invention, and FIGS. 4A–4P illustrate the exemplary transistor device at various stages of fabrication in accordance with the invention.

FIG. 3 is a flow diagram illustrating a method 300 of fabricating a semiconductor device that selectively applies tensile strain to an NMOS region in accordance with an aspect of the present invention. While the exemplary method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 300 begins at 302, wherein transistor fabrication is initiated, and transistor well formation and isolation processing is performed at 304 thereby defining NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 300 continues at 306, wherein a gate oxide layer is formed in active areas defined by the various formed isolation regions. In one example, the gate oxide comprises a thin, thermally grown silicon dioxide layer, however, other type gate dielectrics (such as high-k dielectrics) may be formed and are contemplated by the present invention. A conductive gate layer is then deposited over the gate oxide at 308 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at 310. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at 312 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 3, sidewall spacers are then formed on the gate structures at 314. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the NMOS region by masking the PMOS region with a resist mask, exposing the NMOS region, and implanting n-type dopants (e.g., phosphorous) at 316. The source/drain dopant is introduced into the exposed areas (top of gate electrode and active areas not covered by the sidewall spacers).

A strain inducing cap poly layer is formed over the device at 318. The cap poly layer is comprised of one or more layers that induce strain when subjected to a thermal process. A composition and thickness of layers comprising the cap poly layer are selected to attain a desired amount and type of strain as well as protect underlying layers/regions of the device. The strain inducing property of the cap poly layer is referred to as the cap poly effect.

As an example, a suitable cap poly layer can be formed by depositing a lower oxide layer, depositing a nitride layer on the lower oxide layer, and depositing a top oxide layer on the nitride layer. In this example, the lower oxide layer has a suitable thickness such as, for example, about 30 to 300 Angstroms, which serves as an etch stop layer and protects underlying portions of the semiconductor device. The nitride layer is formed on the lower oxide layer and has a suitable thickness such as, for example, about 300 to about 800 Angstroms selected to provide a desired amount of uniaxial or biaxial tensile strain in channel regions of devices within the NMOS region. The top oxide layer is formed on the nitride layer and serves to facilitate patterning of the cap poly layer by permitting photoresist to more easily adhere to the cap poly layer. Typically, the top oxide layer is about 10 to 30 Angstroms thick.

A portion of the cap poly layer is removed at 320 from the PMOS region by employing an etch process to remove the nitride layer within the PMOS region. A resist mask is employed to prevent the cap poly layer from being removed in the NMOS region. For the exemplary nitride containing cap poly layer described above, the etch process can include a dry etch process selective to nitride, but than can etch through the thin top layer. The lower oxide layer operates as an etch stop for the dry etch process in the PMOS region. It is appreciated that at least a portion of the lower oxide layer remains in the PMOS region after the exemplary etch.

Continuing with the method 300, source/drain implants are performed in the PMOS region by employing the resist mask and/or the cap poly layer as a mask and implanting p-type dopants (e.g., boron) at 322. The source/drain dopant is introduced into the exposed areas (top of gate electrode and active areas not covered by sidewall spacers).

A thermal process (e.g., spike anneal, rapid thermal anneal, and the like) is performed at 324 in order to induce the desired type and amount of strain within channel regions of NMOS transistor devices. A time and temperature employed in the thermal process are selected according to characteristics of the transistors being formed, composition of the cap poly layer, and the desired type and amount of strain to be induced.

As shown above, the cap poly layer is only present within the NMOS region. Accordingly, uniaxial or biaxial tensile strain resulting from the cap poly layer is introduced to channel regions of the NMOS devices and not channel regions of the PMOS devices. Thus, channel mobility (electron mobility) is improved in the NMOS regions and degradation of channel mobility is mitigated because the cap poly layer is not present over the PMOS region.

The cap poly layer is removed at 326 by, for example, employing a suitable etch process. For a nitride containing cap poly layer as described above, a suitable etch process is a wet etch process that employs sulfuric acid.

The method 300 then concludes with silicide processing at 328, wherein a refractory metal material is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at 330 to conclude the device formation at 332.

Turning now to FIGS. 4A–4P, a plurality of fragmentary cross section diagrams illustrating a transistor device being formed in accordance with the present invention by the method 300 of FIG. 3 is provided. In FIG. 4A, a transistor device 402 is provided, wherein a semiconductor body 404, such as a semiconductor substrate, has a number of wells formed therein, such as a P-well 406 to define an NMOS transistor device region and an N-well 408 to define a PMOS transistor device region, respectively. Further, isolation regions 410 such as STI regions are formed in the semiconductor body to define active area regions 411, as may be appreciated. In FIG. 4B, the transistor device 402 is illustrated, wherein a gate oxide 412 has been formed, for example, by thermally grown $SiO_2$, over the active areas 411.

Referring to FIG. 4C, a conductive gate electrode material (e.g., polysilicon, doped polysilicon, and the like) has been deposited and patterned via an etching process 415 to form gate electrodes 414 overlying the gate oxide 412. Turning now to FIG. 4D, offset spacers 416 are then formed on the lateral edges of the gate electrode. The offset spacers 416 are comprised of an insulative material, such as nitride or oxide, and are relatively thin. The offset spacers 416 operate to protect the gate electrodes 414 and to align and define subsequently formed regions.

The PMOS region is then masked, as illustrated in FIG. 4E with a masking material 426 such as photoresist, and an extension region implant 428 is performed to form n-type extension regions 430 in the NMOS region. The n-type extension region mask 426 is then removed and a p-type extension region mask 432 is deposited and patterned to cover the NMOS region, as illustrated in FIG. 4F. A p-type extension region implant process 434 is performed to form p-type extension regions 436 in the PMOS region, as illustrated in FIG. 4F. The mask 432 is then removed and a thermal process such as a rapid thermal anneal is typically performed to activate the implanted dopants, wherein a lateral diffusion of the extension regions 430, 436 under the offset spacers 416 can be achieved.

Sidewall spacers 438 are formed over the offset spacers 416 on the lateral edges of the gate structures as shown in FIG. 4G. To form the sidewall spacers 438, insulating sidewall material(s) are deposited in a generally conformal manner over the device and subsequently subjected to an anisotropic etch to remove the insulating material on top of the gate and over the active areas, leaving sidewall spacers 438 in both the NMOS and PMOS regions, as illustrated in FIG. 4G. Some examples of suitable insulative materials include oxide and nitride.

Source and drain regions 440 are formed in the NMOS region as shown in FIG. 4H. The source and drain regions 440 are formed by a source/drain implant 443 with an NSD mask 439 to implant an n-type dopant in the NMOS region.

It is appreciated that variations of these masks can be employed in the present invention to implant n-type dopants. As can be seen in FIG. 4H, the source/drain regions 440 are self-aligned with respect to the sidewall spacers 438, and thus are laterally spaced from the extension regions 430. FIG. 4I illustrates the device after removal of the NSD mask 439 and also illustrates that the source/drain regions 440 are formed in the NMOS region, but source/drain regions are not yet formed in the PMOS region.

A cap poly layer 442 is formed over the device in both the NMOS and PMOS regions as illustrated in FIG. 4J. An exemplary cap poly layer can be formed by depositing or growing a lower oxide layer 462, a nitride layer 464, and a top oxide layer 466. FIG. 4K is a close up view of the device and further illustrates the exemplary cap poly layer 442. The nitride layer 464 is shown formed on the lower oxide layer 462. The top oxide layer 466 is formed on the nitride layer 464.

The lower oxide layer 462 has a suitable thickness, for example of about 30 to 300 Angstroms. The lower oxide layer 462 serves as an etch stop layer and protects underlying portions of the device. The nitride layer 464 is formed on the lower oxide layer 462 and has a suitable thickness, for example, about 300 to 800 Angstroms. The thickness of the nitride layer 464 is selected according to a desired amount of tensile strain to be applied to channel regions of NMOS devices within the NMOS region. This strain is also referred to as the cap poly effect. The top oxide layer 466 is formed on the nitride layer 464 and is facilitates patterning of the cap poly layer 442 by allowing photoresist to more easily adhere to the cap poly layer 442. The top oxide layer 466 is thick enough to facilitate the adherence of the photoresist to the top oxide layer 426, such as, about 10 to 30 Angstroms. However, it is appreciated that other suitable layers and compositions that induce tensile stress can be employed for the cap poly layer 442.

A portion of the cap poly layer 442 is removed from the PMOS region by a dry etch process. A PSD mask (not shown) is employed to selectively remove the portion of the cap poly layer 442 from the PMOS region while leaving the cap poly layer substantially intact within the NMOS region. For the exemplary cap poly layer described above, a dry etch process selective to nitride is employed that etches through the top oxide layer 466, because of its thinness, and then through the nitride layer 464. The lower oxide layer 462 is utilized as an etch stop layer. FIG. 4L depicts the device with the portion of the cap poly layer 442 removed from the PMOS region.

Source and drain regions 444 are formed in the PMOS region as shown in FIG. 4M. The source and drain regions 444 are formed by a source/drain implant 445 using the PSD mask and/or the cap poly layer 442 as a mask in order to selectively implant a p-type dopant only within the PMOS region. Due to the ability of the cap poly layer 442 to operate as a mask, the PSD mask can be removed before or after formation of the source drain regions 444.

FIG. 4N depicts the device after formation of the source and drain regions 444. It can be seen that the source/drain regions 444 are self-aligned with respect to the sidewall spacers 438, and thus are laterally spaced from the extension regions 430. A thermal process can then be employed to activate the implanted p-type dopant within the PMOS regions and further form the source and drain regions 444. As described above, the cap poly layer 442 is not present within the PMOS region and, as a result, degradation of devices within the PMOS region from the thermal process and the cap poly layer 442 is mitigated.

FIG. 4O depicts the device after removal of the cap poly layer 442. A suitable process employed to remove the cap poly layer 442 is a wet etch process, such as one employing sulfuric acid. However, it is appreciated that other types of etching can be performed to remove the cap poly layer 442 in accordance with the present invention. A thermal process (e.g., spike anneal, rapid thermal anneal, and the like) is performed that, in combination with the cap poly layer 442, induces the desired type and amount of strain within channel regions of NMOS transistor devices. A time and temperature employed in the thermal process are selected according to characteristics of the transistors being formed, composition of the cap poly layer, and the desired type and amount of strain to be induced. Degradation of PMOS transistor devices by the cap poly layer 442 is mitigated because it is not substantially present within the PMOS region yet channel mobility for NMOS devices is improved as a result.

Continuing, silicide regions 452 are formed on active regions and gate electrodes 414 by a suitable silicidation process. FIG. 4P depicts the semiconductor device after formation of the silicide regions. Typically, silicide regions are formed by depositing a refractory metal (e.g., aluminum, cobalt, alloys thereof, and the like) is over the device and inducing (e.g., by annealing) the deposited refractory metal to react with underlying silicon forming silicide regions that reduce contact resistance between active regions and electrodes with contacts, interconnects, and the like. Un-reacted refractory metal is then removed. Subsequently, back end processing, including metallization to interconnect the various transistors, may be performed, as may be desired.

While, for purposes of simplicity of explanation, the methodologies of FIGS. 1, 2 and 3 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising: forming source/drain regions in active areas of an NMOS region; forming a cap poly layer over the NMOS region and a PMOS region of the semiconductor device; removing a portion of the cap poly layer from the PMOS region; forming source/drain regions in active areas of the PMOS region subsequent to removing the portion of the cap poly layer from the PMOS region; and, with the cap poly layer over the NMOS region, performing a thermal process that induces tensile strain in channel regions of the NMOS region.

2. The method of claim 1, further comprising forming gate electrodes in the PMOS region and the NMOS region prior to forming the source/drain regions in the active areas of the NMOS region.

3. The method of claim 2, further comprising forming well regions and isolation regions in a semiconductor substrate of the PMOS and NMOS regions prior to forming the gate electrodes.

4. The method of claim 3, further comprising forming extension regions in the PMOS and NMOS regions prior to forming the cap poly layer.

5. The method of claim 1, further comprising removing the cap poly layer subsequent performing the thermal process.

6. The method of claim 5, wherein forming source/drain regions in the PMOS region is subsequent to performing the thermal process.

7. The method of claim 5, wherein forming source/drain regions in the PMOS region is performed prior to performing the thermal process.

8. The method of claim 1, wherein the cap poly layer is formed by depositing a lower oxide layer over the device, depositing a nitride layer on the lower oxide layer, and depositing a top oxide layer on the nitride layer.

9. The method of claim 8, wherein the nitride layer is deposited to a thickness selected according to a desired amount of induced tensile strain.

10. The method of claim 9, wherein the selected thickness is from a range of about 200 to 1200 Angstroms.

11. The method of claim 1, wherein the cap poly layer is formed to a thickness selected according to a desired amount of induced tensile strain.

12. The method of claim 1, wherein the thermal process is performed for a duration and temperature corresponding to a desired amount of induced tensile strain.

13. A method of fabricating a semiconductor device comprising:
   forming a lower oxide layer over NMOS and PMOS regions of the semiconductor device;
   forming a nitride layer on the lower oxide layer;
   forming a top oxide layer on the nitride layer;
   selectively removing a portion of the top oxide layer and a portion of the nitride layer from the PMOS region using a PSD resist mask; and
   selectively implanting a p-type dopant forming source/drain regions in the PMOS region using the PSD resist mask.

14. The method of claim 13, further comprising performing a thermal process to introduce tensile strain to channel regions of devices within the NMOS region.

15. The method of claim 13, further comprising selectively implanting an n-type dopant forming source/drain regions within the NMOS region using an NSD resist mask.

16. The method of claim 13, where the nitride layer is formed to a thickness selected according to a desired amount of induced tensile strain.

17. A method of fabricating a semiconductor device comprising:

performing well formation and isolation processing in a semiconductor body;
forming a gate oxide layer on the semiconductor body;
forming gate electrodes on the gate oxide layer;
forming offset spacers on lateral edges of the gate electrodes;
forming extension regions in the semiconductor body in NMOS and PMOS regions;
forming sidewall spacers adjacent the offset spacers;
implanting n-type dopant(s) to form source/drain regions in the NMOS region using an NSD resist mask;
forming a cap poly layer over the device;
removing a portion of the cap poly layer from the PMOS region using a PSD resist mask; and
implanting p-type dopant(s) to form source/drain regions in the PMOS region using the PSD resist mask.

18. The method of claim 17, further comprising performing a spike anneal to induce tensile strain to channel regions within the NMOS region.

19. The method of claim 17, further comprising removing the cap poly layer via a wet etch process.

20. The method of claim 17, further comprising forming silicide regions on the source/drain regions and gate electrodes in the PMOS and NMOS regions.

* * * * *